(12) United States Patent
Xie et al.

(10) Patent No.: US 12,641,844 B2
(45) Date of Patent: May 26, 2026

(54) SHARED SOURCE/DRAIN CONTACT FOR STACKED FIELD-EFFECT TRANSISTOR

(71) Applicant: International Business Machines Corporation, Armonk, NY (US)

(72) Inventors: Ruilong Xie, Niskayuna, NY (US); Koichi Motoyama, Clifton Park, NY (US); Nicholas Alexander Polomoff, Hopewell Junction, NY (US); Leon Sigal, Monsey, NY (US)

(73) Assignee: International Business Machines Corporation, Armonk, NY (US)

( * ) Notice: Subject to any disclaimer, the term of this patent is extended or adjusted under 35 U.S.C. 154(b) by 308 days.

(21) Appl. No.: 18/056,731

(22) Filed: Nov. 18, 2022

(65) Prior Publication Data

US 2024/0170532 A1 May 23, 2024

(51) Int. Cl.
| | |
|---|---|
| *H10D 62/10* | (2025.01) |
| *H10D 30/01* | (2025.01) |
| *H10D 30/43* | (2025.01) |
| *H10D 30/67* | (2025.01) |
| *H10D 84/01* | (2026.01) |
| *H10D 84/03* | (2025.01) |

(52) U.S. Cl.
CPC ......... *H10D 62/121* (2025.01); *H10D 30/014* (2025.01); *H10D 30/43* (2025.01); *H10D 30/6729* (2025.01); *H10D 30/6757* (2025.01); *H10D 84/0128* (2025.01); *H10D 84/013* (2025.01); *H10D 84/038* (2025.01)

(58) Field of Classification Search
CPC . H10D 62/121; H10D 30/6757; H10D 84/013
See application file for complete search history.

(56) References Cited

U.S. PATENT DOCUMENTS

| | | | |
|---|---|---|---|
| 9,659,963 B2 | 5/2017 | Cheng | |
| 9,837,414 B1 | 12/2017 | Balakrishnan | |
| 10,163,720 B2 | 12/2018 | Kuo | |
| 10,192,867 B1 * | 1/2019 | Frougier | ............... H10D 84/85 |
| 10,707,866 B1 | 7/2020 | Liang | |
| 2019/0139830 A1 | 5/2019 | Xie | |
| 2021/0408231 A1 | 12/2021 | Huang | |
| 2022/0173090 A1 | 6/2022 | Gomes | |

FOREIGN PATENT DOCUMENTS

| | | |
|---|---|---|
| EP | 2422594 A1 | 2/2012 |
| WO | 2010123671 A1 | 10/2010 |

OTHER PUBLICATIONS

Manoj et al., "FET Structures for Future Technology Nodes", International Research Journal of Engineering and Technology, vol. 08 Issue: 07 | Jul. 2021, 5 pages.

* cited by examiner

*Primary Examiner* — Steven M Page
(74) *Attorney, Agent, or Firm* — Gavin Giraud

(57) ABSTRACT

Embodiments herein include semiconductor structures that may include a first field-effect transistor (FET) comprising a first source/drain (S/D), a second FET comprising a second S/D squarely above the first S/D, and a shared S/D contact. The shared S/D may include a recessed portion between the first S/D and the second S/D, a side portion above the recessed portion, and a top portion above the second S/D. The side portion may contact a lateral side of the second S/D.

13 Claims, 16 Drawing Sheets

SHARED SOURCE/DRAIN CONTACT FOR STACKED FIELD-EFFECT TRANSISTOR

BACKGROUND

The present invention relates generally to the field of fabrication of semiconductor structures, and more particularly to forming a stacked FET device with shared source/drain contact between top and bottom devices.

In fabricating semiconductor structures, millions of devices can be located together on a single substrate. The continued scaling of metal oxide semiconductor field effect transistors (MOSFETs) has enabled useful control of these millions of devices. Stacked nanosheet designs seek to continue improvement in performance by using several thin channels with gate electrodes. Nanosheet transistors typically start with a Si/SiGe heterostructure, with as many layer pairs as the finished device will have channels. The channels are fabricated as nanosheet layers built up as blanket layers over the surface of the wafer, with dummy layers alternately fabricated or grown as blanket layers between the channel layers. Source/drains (S/Ds) may then be formed in rows or columns between the channel layers. Stacked FET transistor is a type of device that enables density scaling by forming one transistor over another. Very often, a PFET can be stacked over an NFET (or vice versa) to form a CMOS cell using a stacked FET.

One challenge in fabricating a stacked FET is to form the shared contact for the top FET and the bottom FET. In many instances, the shared contact can be formed by forming a deep S/D contact through the top FET to reach to the bottom FET, which reduces the S/D volume of the top S/D. Other instances of the shared contact may have a small area of contact with one of the S/Ds, or an area of contact that is less than the full area of the S/D. Other instances can compromise the silicide between the contact and the S/Ds by annealing the semiconductor structure after silicide formation.

SUMMARY

According to one embodiment of the present invention, a semiconductor structure includes a first field-effect transistor (FET) with a first source/drain (S/D) and a second FET with a second S/D squarely above the first S/D. The stacked FETs provide the benefit of increased density and efficiency of the semiconductors structure. The semiconductor structure may also include a shared S/D contact. The shared S/D contact includes a recessed portion between the first S/D and the second S/D; a side portion above the recessed portion, and a top portion above the second S/D. The side portion may contact a lateral side of the second S/D. The shared S/D contact provides the benefit of low-resistance contact for both the first S/D and the second S/D due to the wider contact area and better formation of silicide. For example, certain embodiments of the shared S/D contact may be formed with the recessed portion covering full width of a top side of the first S/D.

In certain embodiments, the FETs may include additional S/Ds to provide the benefit of further electrical connection for the semiconductor structure. For example, the first FET may include a bottom S/D connected to a backside contact on a bottom side. The second FET may also include a top S/D connect to a frontside contact on a top side.

According to one embodiment of the present invention, a method is disclosed. The method may include growing a first S/D and a preliminary second S/D stacked squarely above the first S/D and etching a recessed portion opening through the preliminary second S/D to expose the first S/D, and forming a preliminary contact in the recessed portion opening. This preliminary contact may be formed with silicide uncompromised by thermal treatments, and thus has low-resistance connection with the first S/D. The method may then include recessing the preliminary contact to form a recessed portion and regrowing a regrown second S/D above the recessed contact. Regrowing the second S/D maintains the benefit of the strong connection by the preliminary contact and maintains the further benefit of density and efficiency provided by the stacked FET devices.

In certain embodiments, the second S/D may be regrown on remnants of the preliminary second S/D, which provides the benefit of strong electrical connection with the gate, and accurately located epitaxial growth for the regrown second S/D.

According to one embodiment of the present invention, a semiconductor structure is disclosed. The semiconductor structure may include a first field-effect transistor (FET) that has a first source/drain (S/D); a second FET with a second S/D squarely above the first S/D, and a shared S/D contact contacting a top side of the first S/D, and contacting a bottom side, a first lateral side, and a top side of the second S/D. The shared contact enables strong, low-resistance connection to both the first S/D and the second S/D.

BRIEF DESCRIPTION OF THE DRAWINGS

FIG. 2A shows the semiconductor structure at a cross-sectional view along line A-A'. FIG. 2B shows the semiconductor structure at a cross-sectional view along line B-B'. FIG. 2C shows the semiconductor structure at a cross-sectional view along line C-C'.

FIG. 3A shows the semiconductor structure at a cross-sectional view along line A-A'. FIG. 3B shows the semiconductor structure at a cross-sectional view along line B-B'. FIG. 3C shows the semiconductor structure at a cross-sectional view along line C-C'.

FIG. 4A shows the semiconductor structure at a cross-sectional view along line A-A'. FIG. 4B shows the semiconductor structure at a cross-sectional view along line B-B'. FIG. 4C shows the semiconductor structure at a cross-sectional view along line C-C'.

FIG. 5A shows the semiconductor structure at a cross-sectional view along line A-A'. FIG. 5B shows the semiconductor structure at a cross-sectional view along line B-B'. FIG. 5C shows the semiconductor structure at a cross-sectional view along line C-C'.

FIG. 6A shows the semiconductor structure at a cross-sectional view along line A-A'. FIG. 6B shows the semiconductor structure at a cross-sectional view along line B-B'. FIG. 6C shows the semiconductor structure at a cross-sectional view along line C-C'.

FIG. 7A shows the semiconductor structure at a cross-sectional view along line A-A'. FIG. 7B shows the semiconductor structure at a cross-sectional view along line B-B'. FIG. 7C shows the semiconductor structure at a cross-sectional view along line C-C'.

FIG. 8A shows the semiconductor structure at a cross-sectional view along line A-A'. FIG. 8B shows the semiconductor structure at a cross-sectional view along line B-B'. FIG. 8C shows the semiconductor structure at a cross-sectional view along line C-C'.

FIG. 9A shows the semiconductor structure at a cross-sectional view along line A-A'. FIG. 9B shows the semiconductor structure at a cross-sectional view along line B-B'. FIG. 9C shows the semiconductor structure at a cross-sectional view along line C-C'.

DETAILED DESCRIPTION

Figure 2A:
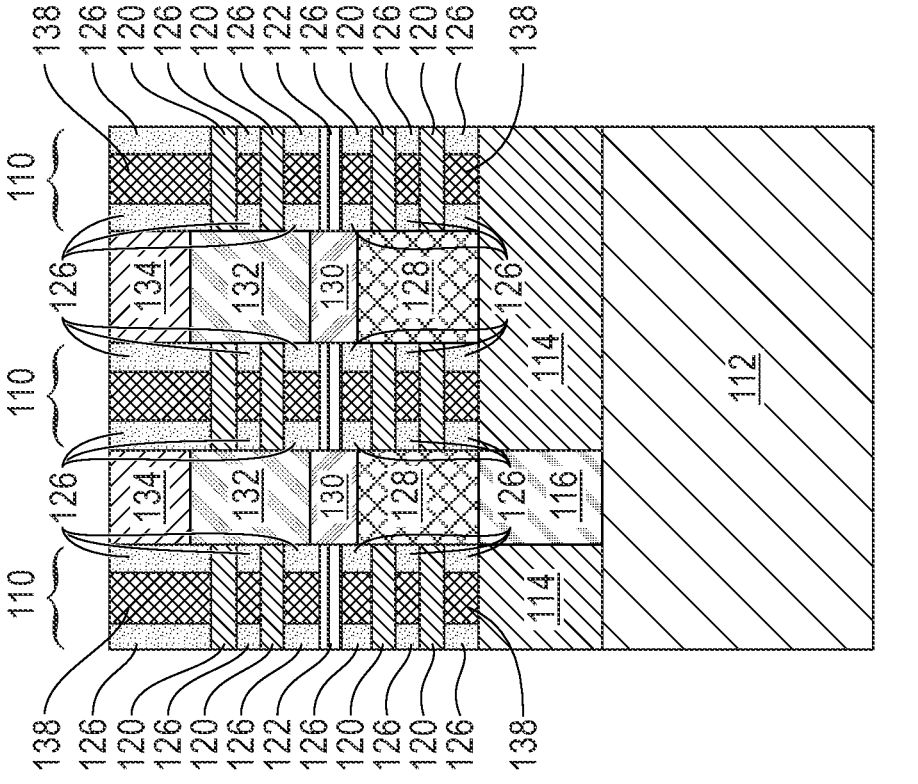
FIGS. 2A-2C depict cross-sectional side views of the semiconductor structure of FIG. 1 at a stage of fabrication, in accordance with one embodiment of the present invention.

In the following detailed description, reference is made to the accompanying drawings, which show specific examples of embodiments of the invention. These embodiments are described in sufficient detail to enable those skilled in the art to practice them, and it is to be understood that other embodiments may be utilized, and that structural, logical and electrical changes may be made without departing from the described embodiments. The following detailed description is, therefore, not to be taken in a limiting sense, and the included embodiments are defined by the appended claims.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "right," "left," "vertical," "horizontal," "top," "bottom," "lower," "upper" and derivatives thereof shall relate to the disclosed structures and methods, as oriented in the drawing Figures. The terms "overlaying," "atop," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

With regard to the fabrication of transistors and integrated circuits, major surface refers to that surface of the semiconductor layer in and about which a plurality of transistors are fabricated, e.g., in a planar process. As used herein, the term "vertical" means substantially orthogonal with respect to the major surface and "horizontal" means substantially parallel to the major surface. Typically, the major surface is along a plane of a monocrystalline silicon layer on which transistor devices are fabricated.

It will be understood that when an element as a layer, region, or substrate is referred to as being "on" or "over" another element, it can be directly on the other element or intervening elements may also be present. In contrast, when an element is referred to as being "directly on" or "directly above" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present. It will also be understood that when an element is referred to as being "squarely beneath" or "squarely above" another element, the elements overlap such that a line (e.g., imaginary) that is square (i.e., perpendicular) to the major surface passes through both elements.

For integrated circuits, the masking, patterning, and etching of device components makes possible the fabrication of semiconductor structures at the micro and nano scale. Such small component size means that improvements in performance require high precision in the dimensions and materials used in the completed devices. For the instant invention, a source/drain (S/D) contact is fabricated to improve the connection between an upper S/D and a lower S/D of stacked field-effect transistors (FETs). The improvement is achieved by forming the S/D contact in multiple stages, which enables the S/D contact to have a good connection with a top side of the lower S/D, while still maintaining good contact around the upper S/D. As explained in detail below, the S/D contact can have a recessed portion that is formed through the upper S/D such that the recessed portion covers the full width of the lower S/D, and then the upper S/D can be regrown. The final S/D contact wraps around the upper S/D for improved electrical conductivity and lower resistance.

Figure 1:
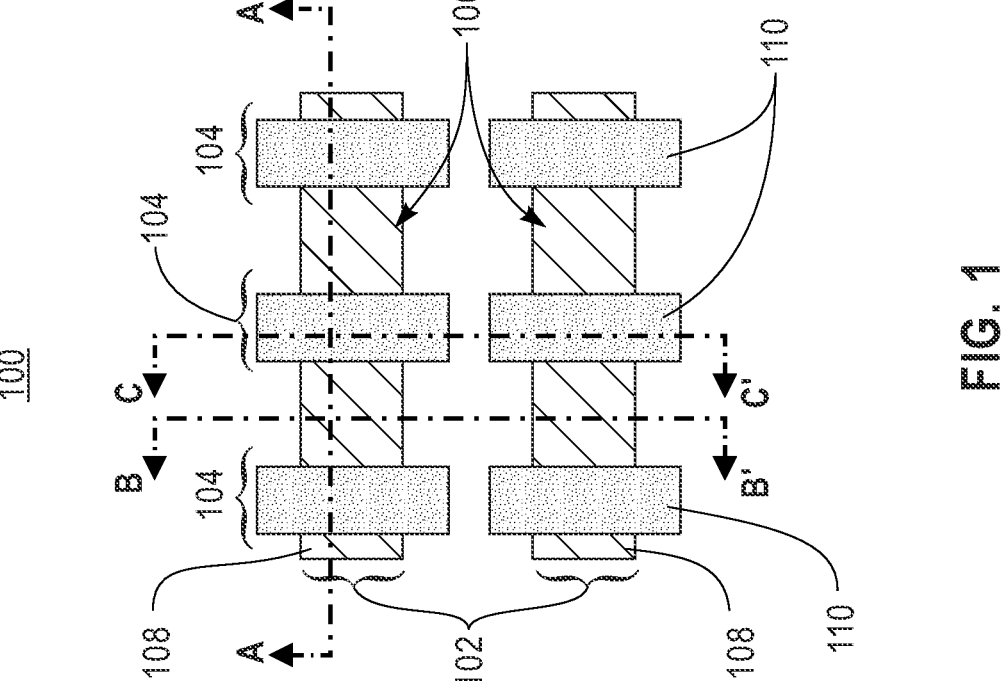
FIG. 1 depicts a top view of a semiconductor structure, in accordance with one embodiment of the present invention.

Turning now to the figures, FIG. 1 depicts a simplified schematic top view of a semiconductor structure 100. The semiconductor structure 100 may be fabricated as a relationship of rows 102 and columns 104 of field-effect transistor (FET) devices 106. For example, the rows 102 may include S/Ds 108 and channels (not shown, covered by gates) while the columns 104 include gates 110. The FETs 106 are activated by initializing the gates 110 to enable a signal between the S/Ds 108. The following figures are cross-sectional views of the semiconductor structure 100 along the lines A-A', B-B', and C-C'. Line A-A' enables the view of three gates 110 and two S/Ds 108. Line B-B' enables the view of two S/Ds in a region between gates 110. Line C-C' enables the view of two gates 110. The views will remain consistent in the following figures, but the components will change in line with fabrication stages of one example of an embodiment of the present invention.

Figure 2C:
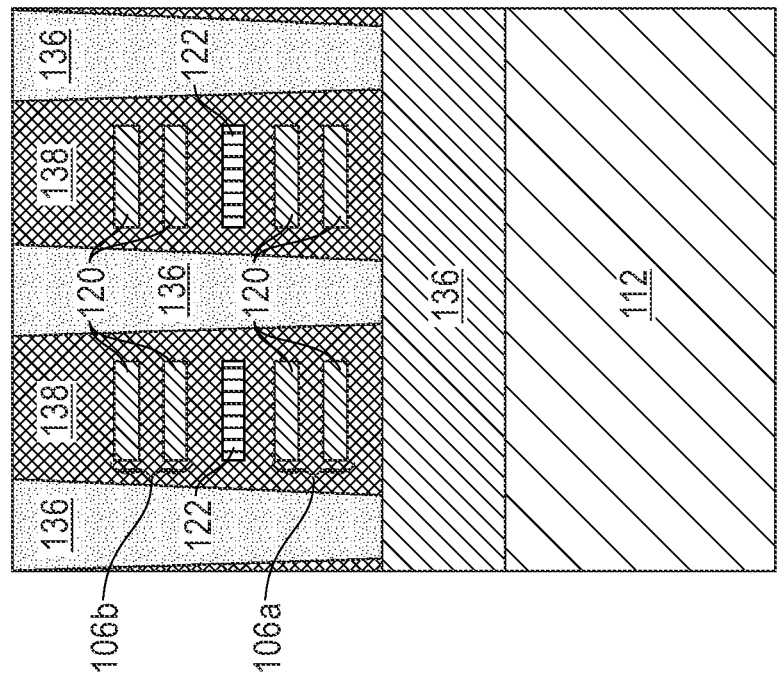
Figure 2B:
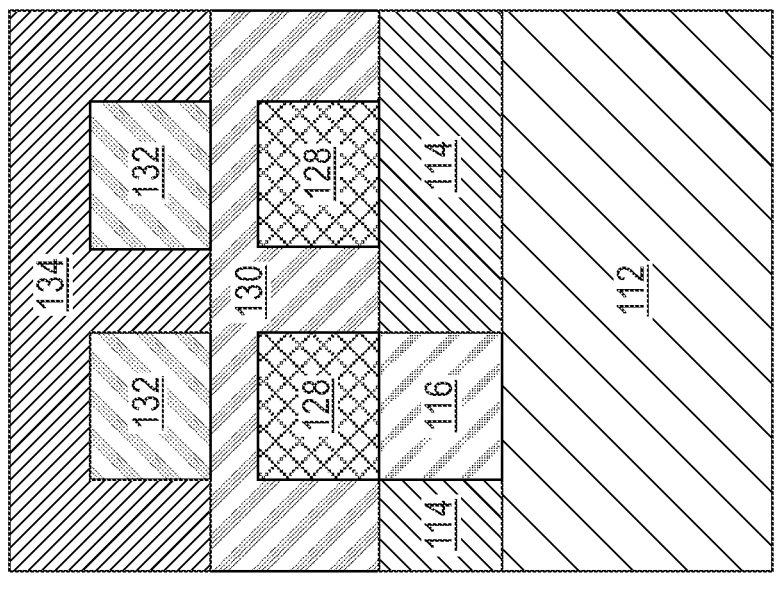

FIGS. 2A-2C depict cross-sectional side views of the semiconductor structure of FIG. 1 at a stage of fabrication, in accordance with one embodiment of the present invention. Various and sundry fabrication methods may be used to arrive at the semiconductor structure 100 shown in FIGS. 2A-2C. For example, the semiconductor structure 100 may be fabricated on a substrate 112. The substrate 112 most often includes silicon, but other materials may also be used. Above the substrate 112, the semiconductor structure 100 includes a buried oxide (BOX) layer 114 with a sacrificial contact 116 that stands in as a placeholder for fabricating a backside contact in a later fabrication stage. The semiconductor structure 100 also includes nanosheet layers 120 that form the channels of the FETs 106. The nanosheet layers 120 may be epitaxially grown as blanket layers using alternating dummy layers and channel layers of silicon (in the illustrated fabrication stage of FIGS. 2A-2C, the dummy layers have already been replaced). The dummy layers further comprise a high Ge % SiGe layer between top nanosheet stack and bottom nanosheet stack, and low Ge % SiGe layer within top and bottom nanosheet stacks between channel nanosheet layers 120. Other methods may be used to form the nanosheet channels and the dummy layers. Certain embodiments may also include other forms of transistors.

Once the nanosheet layers 120 for the FET channels are fabricated as blanket layers, individual fins may be patterned to form active regions. After that, dummy gates are formed over the fins, followed by removal of high Ge % SiGe layer between the top and bottom nanosheet stacks. After that, gate spacer 136 is conformally deposited at sidewalls of dummy gates, and it also fills the gap created by removal of high Ge % SiGe layer and formed middle dielectric isolation (MDI) layer. After that, nanosheet stacks are recessed, followed by low Ge % SiGe layer indentation and inner spacer 126 formation. After that, bottom S/D epi 128, bottom ILD 130 are formed, followed by the formation of top S/D epi 132, top ILD 134, and gate cut 136. After that, dummy gate and low Ge % SiGe layer are removed, and replacement gate 138 is formed. That is, the semiconductor structure 100 may include a first FET 106a, and a second FET 106b above the first FET 106a.

The semiconductor structure 100, therefore, includes bottom FETs 106a and top FETs 106b with S/Ds 128, 132 with gates 110 separating the S/Ds 128, 132. The process below describes one embodiment of adding contacts to connect each of the S/Ds 128, 132 to metal layers or other components of the semiconductor structure 100.

Figure 3A:
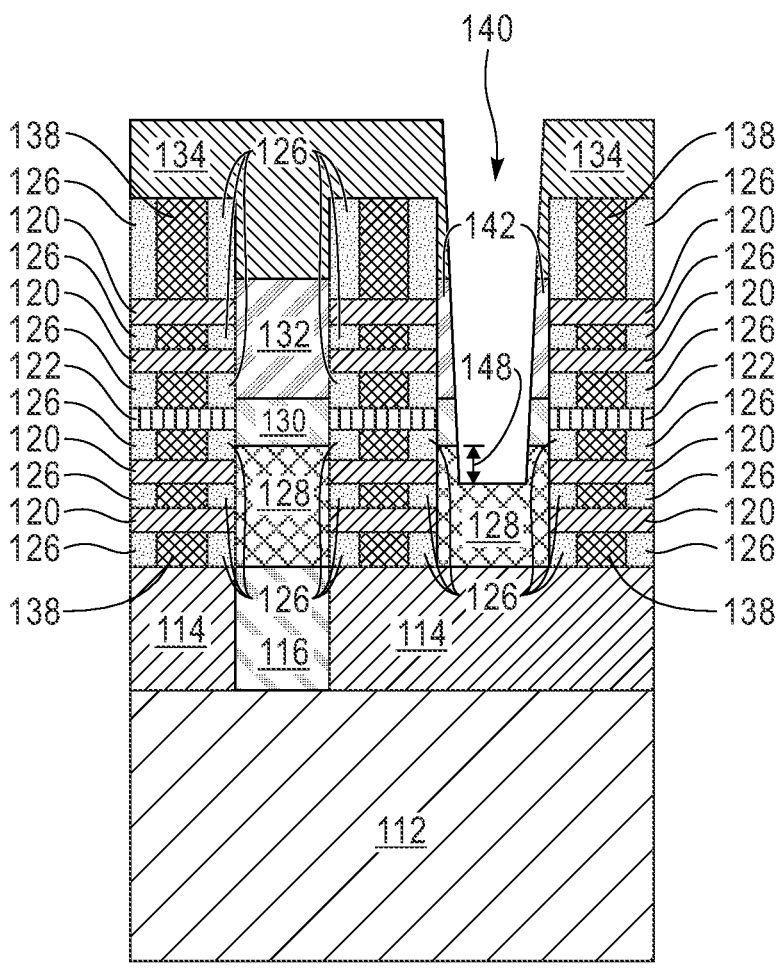
FIGS. 3A-3C depict cross-sectional side views of the semiconductor structure of FIG. 1 at a stage of fabrication, in accordance with one embodiment of the present invention.
Figure 3C:
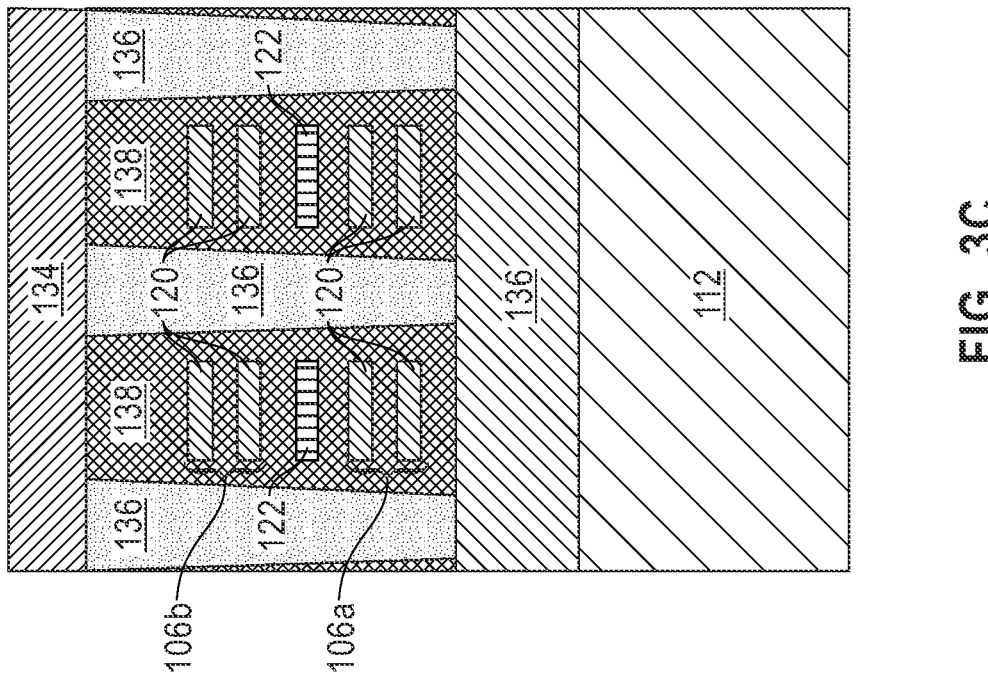
Figure 3B:
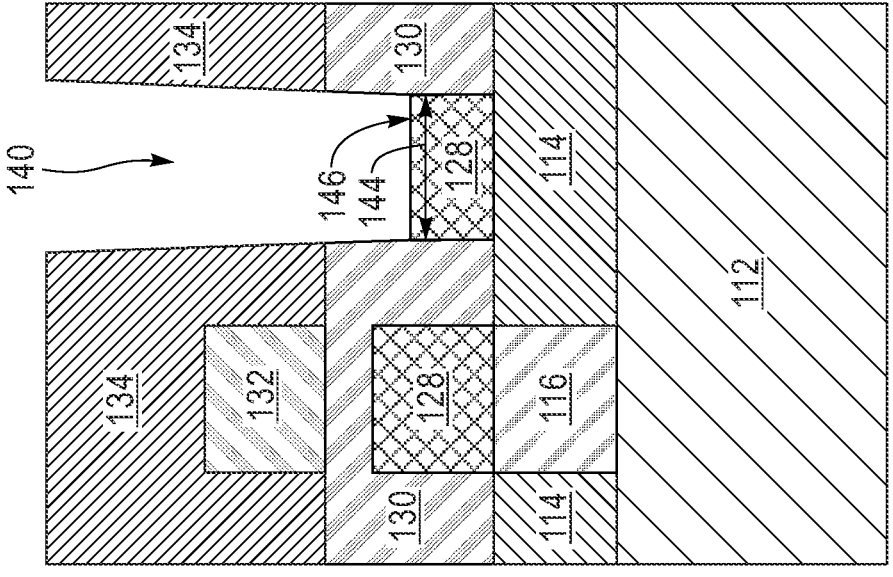

FIGS. 3A-3C depict cross-sectional side views of the semiconductor structure 100 at a stage of fabrication. As mentioned above, the cross-sectional views are the same as those depicted in FIGS. 2A-2C. Subsequent figures will have the same views in the first direction and the second direction without further distinction. The semiconductor structure 100 at this stage of fabrication includes deep contact openings 140 that are etched through the second S/Ds 132 to expose the first S/Ds 128. The deep contact openings 140 may be formed using known patterning, and etching processes. For example, the deep contact openings 140 may be masked and etched by performing lithography to etch through the top ILD 134, the second S/D 132, and the bottom ILD 130. Remnants 142 of the second S/Ds 132 may remain in a first lateral direction, as shown in FIG. 3A, but in some embodiments (including the illustrated embodiment here) the second S/Ds 132 may be fully etched in a second lateral direction as shown in FIG. 3B. The deep contact openings 140 may also be etched in a full width 144 of a top side 146 of the first S/Ds 128 (FIG. 3B), and protrude a contact depth 148 into the first S/Ds 128 (FIG. 3A). The recessed portion openings 140 are typically etched to avoid all portions of the gates 110, including the gate spacers 136 and the inner spacers 126.

Figure 4A:
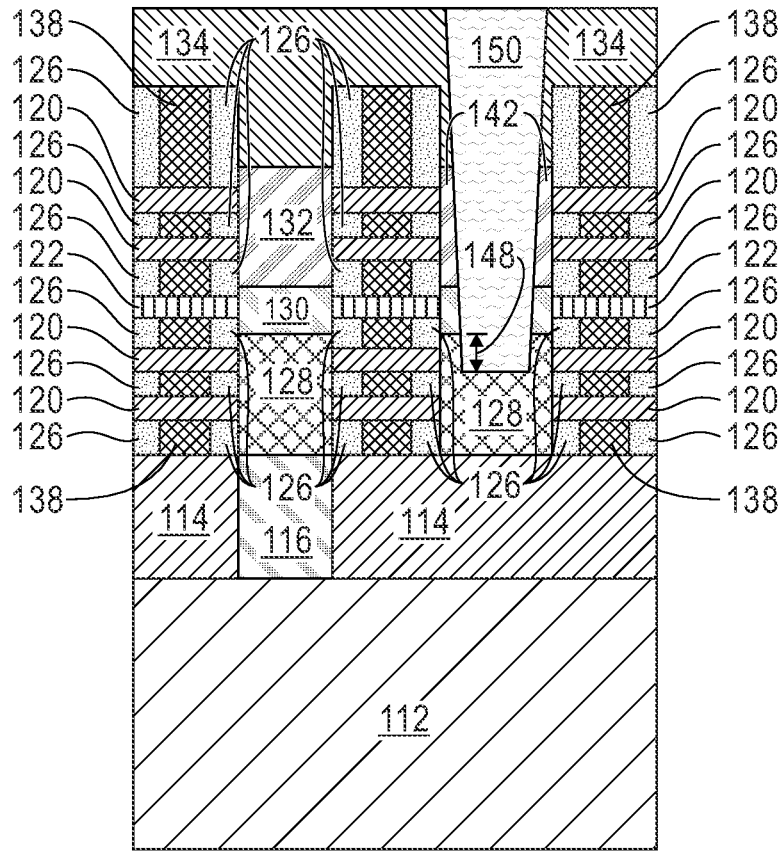
FIGS. 4A-4C depict cross-sectional side views of the semiconductor structure of FIG. 1 at a stage of fabrication, in accordance with one embodiment of the present invention.
Figure 4C:
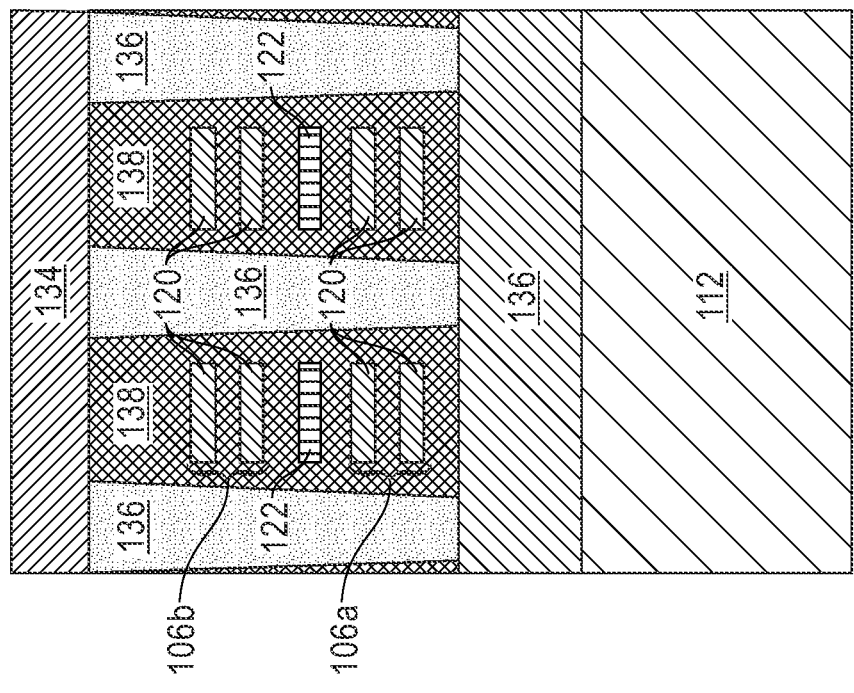
Figure 4B:
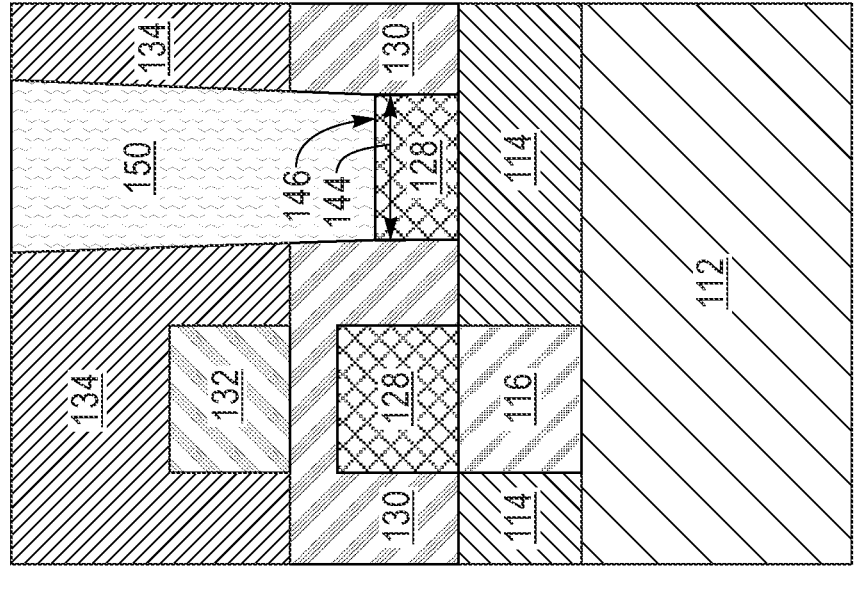

FIGS. 4A-4C depict cross-sectional side views of the semiconductor structure 100 at a stage of fabrication. As mentioned above, the cross-sectional views are along the view lines indicated in FIG. 1. The semiconductor structure 100 includes preliminary contacts 150 formed within the recessed portion openings 140. The preliminary contacts 150 are metalized conductive connections that are fabricated in multiple steps. A first step of forming the preliminary contacts 150 may include forming a silicide liner, such as Ni, Ti, NiPt to form NiSix, TiSix, NiPtSix, NiSiGex with exposed S/D epis. After the silicide liner, the preliminary contacts 150 may then include depositing an adhesion metal liner, such as TiN, followed by low resistance metal fill. Low resistance metal fill examples may include W, Co, Ru, etc. After the metal fill, and the preliminary contacts 150 are completed, the semiconductor structure 100 may be chemically-mechanically polished (CMP) to ensure that the top of the semiconductor structure 100 is as level as possible. The preliminary contacts 150 fill the deep contact openings 140 such that the preliminary contacts 150 cover the exposed full width 144 of a top side 146 of the first S/D 128. Also, the preliminary contacts 150 protrude into the first S/D 128 by the contact depth 148.

Figure 5A:
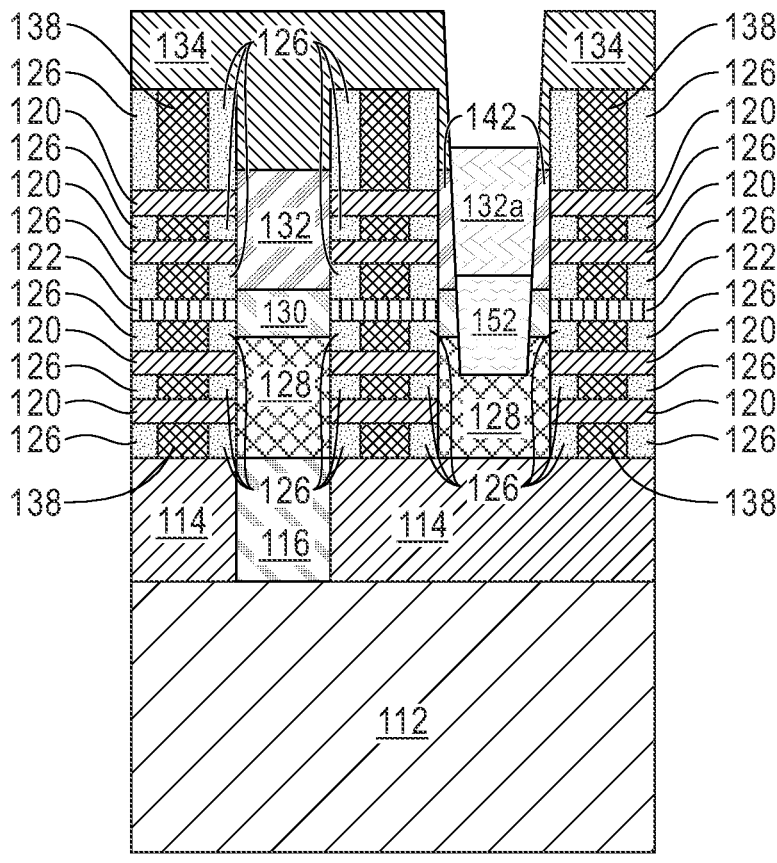
FIGS. 5A-5C depict cross-sectional side views of the semiconductor structure of FIG. 1 at a stage of fabrication, in accordance with one embodiment of the present invention.
Figure 5C:
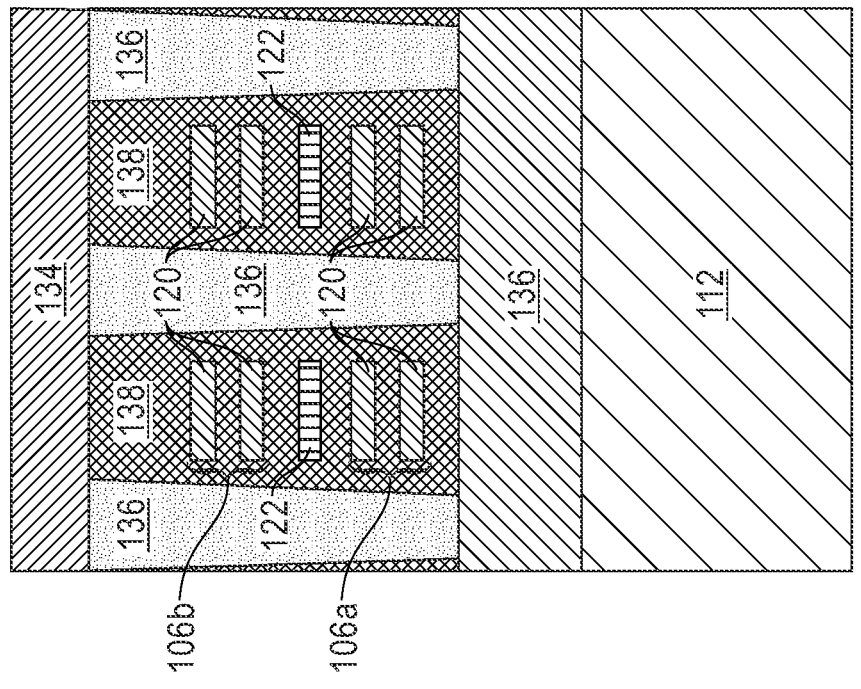
Figure 5B:
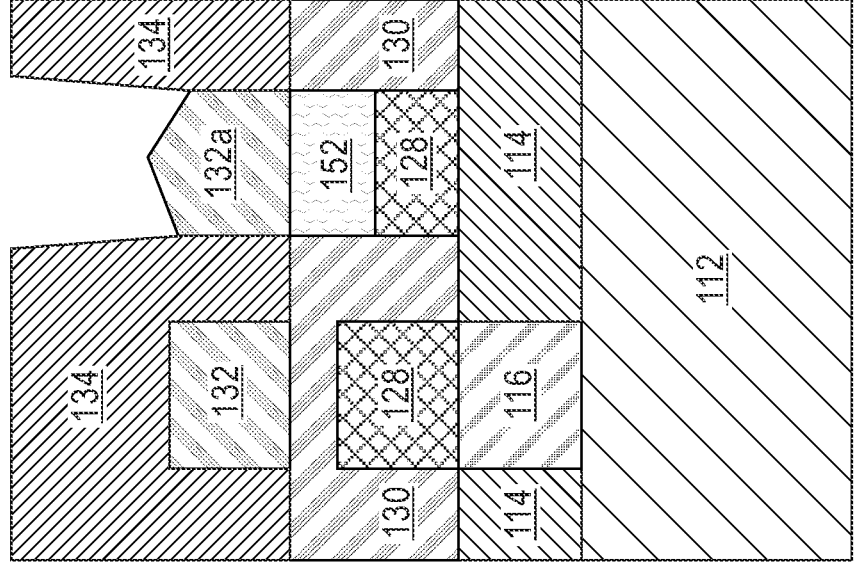

FIGS. 5A-5C depict cross-sectional side views of the semiconductor structure 100 at a stage of fabrication. As mentioned above, the cross-sectional views are along the view lines indicated in FIG. 1. The semiconductor structure 100 includes recessed portions 152 of the preliminary contacts 150 that have been etched or recessed from the top of the semiconductor structure 100. When the preliminary contacts 150 are recessed, the silicide liner is also etched to expose the remnants 142 of the second S/Ds 132. FIGS. 5A and 5B therefore show regrown second S/Ds 132a (functional second contact) that include regrown portions that have been epitaxially grown once again on the remnants 142 of the second S/Ds 128. The boundary between the recessed portion 152 and the first S/D 132a may include a silicide liner to reduce resistance between the recessed portion 152 and the second S/D 132a.

Figure 6A:
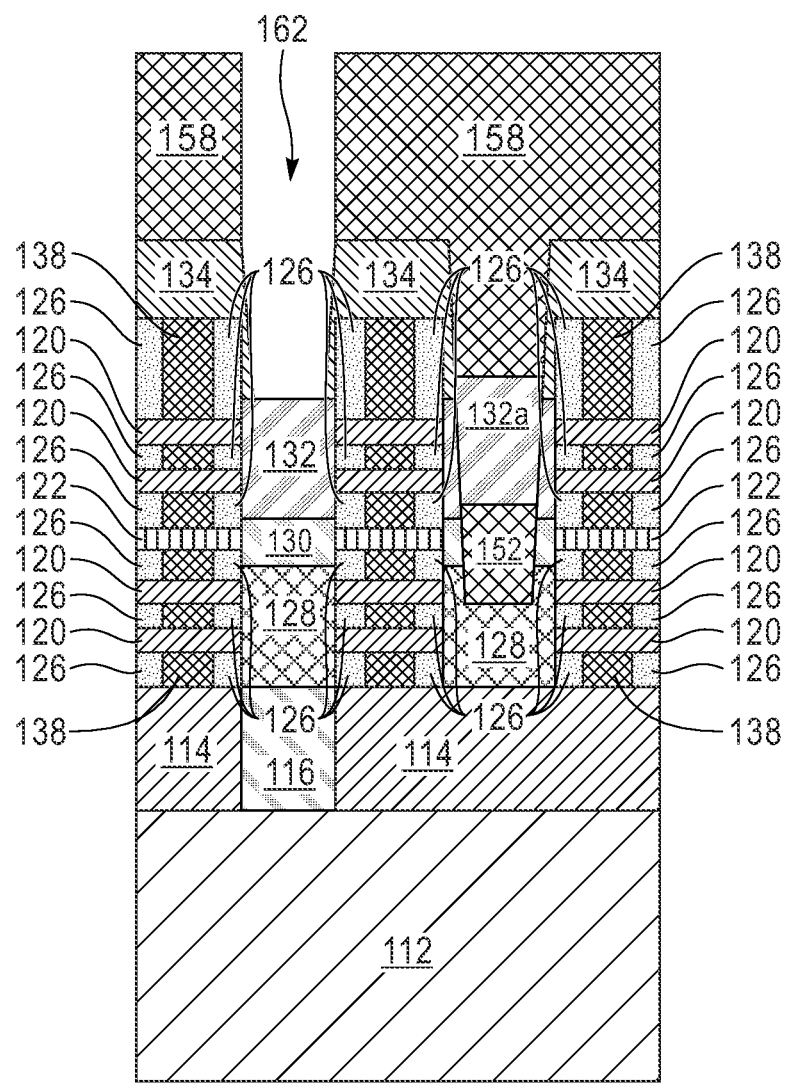
FIGS. 6A-6C depict cross-sectional side views of the semiconductor structure of FIG. 1 at a stage of fabrication, in accordance with one embodiment of the present invention.
Figures 6B, 6C:
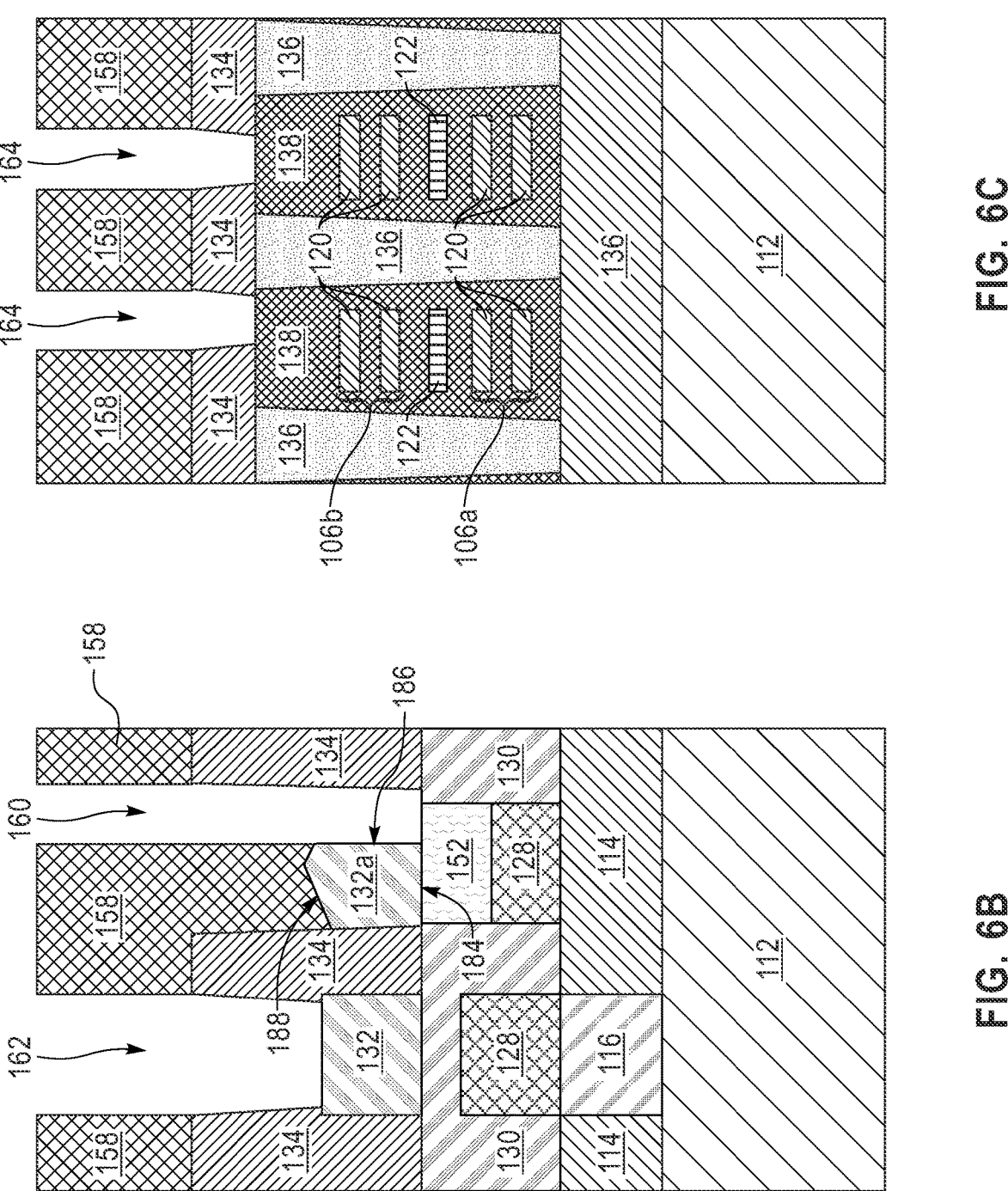

FIGS. 6A-6C depict cross-sectional side views of the semiconductor structure 100 at a stage of fabrication. As mentioned above, the cross-sectional views are along the view lines indicated in FIG. 1. The semiconductor structure 100 includes an organic planarization layer (OPL) 158 covering the semiconductor structure 100. The OPL 158 masks the top ILD 134 and the regrown second S/D 132a except for certain locations where narrow contact openings 160, first top contact openings 162, and gate contact openings 164 are etched. The narrow contact openings 160, the first top contact openings 162, and gate contact openings 164 are shown as being opened in the same step or stage of fabrication, but in certain cases the first top contact openings 162 may be etched and then recovered with the OPL 158, followed by etching the narrow contact opening 160 in a separate process (and recovering with OPL 158), followed by etching the gate contact openings 164 in a third separate process. Furthermore, the etching of the narrow contact openings 160 may include multiple etch steps, specifically a first selective etch process to remove the top ILD 134 followed by a selective etch process to remove the regrown second S/D 132a. Alternatively, the etching of the narrow contact opening 160 may be accomplished with one type of etch, for example a directional reactive ion etch (RIE) process that is used to etch all the way through to the recessed portion 152.

Figure 7A:
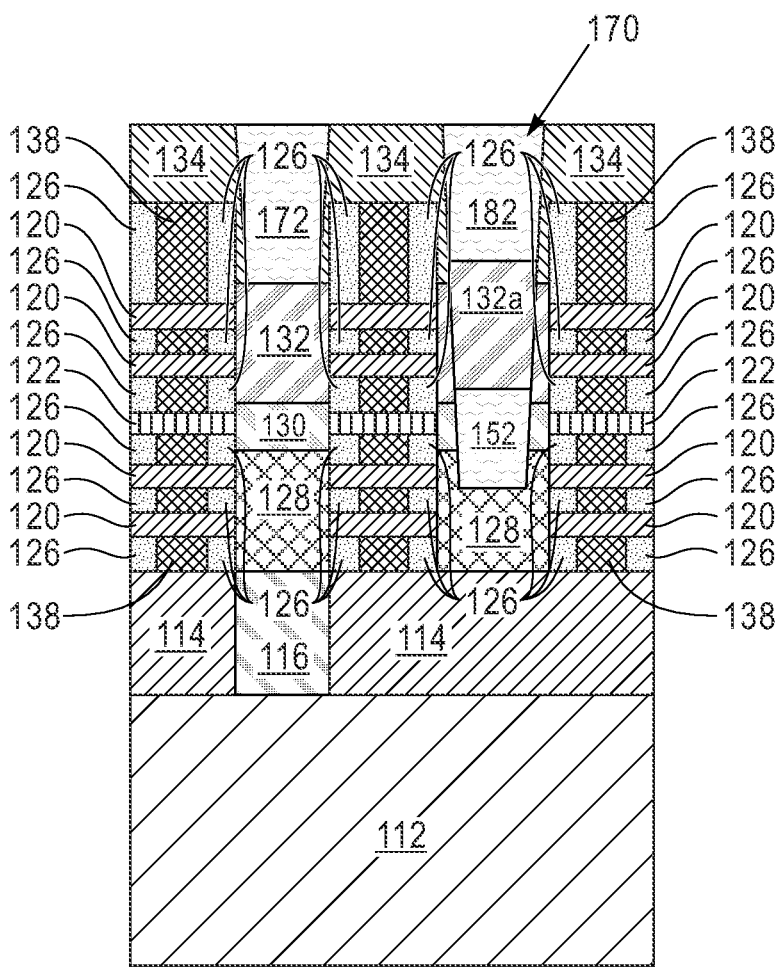
FIGS. 7A-7C depict cross-sectional side views of the semiconductor structure of FIG. 1 at a stage of fabrication, in accordance with one embodiment of the present invention.
Figure 7C:
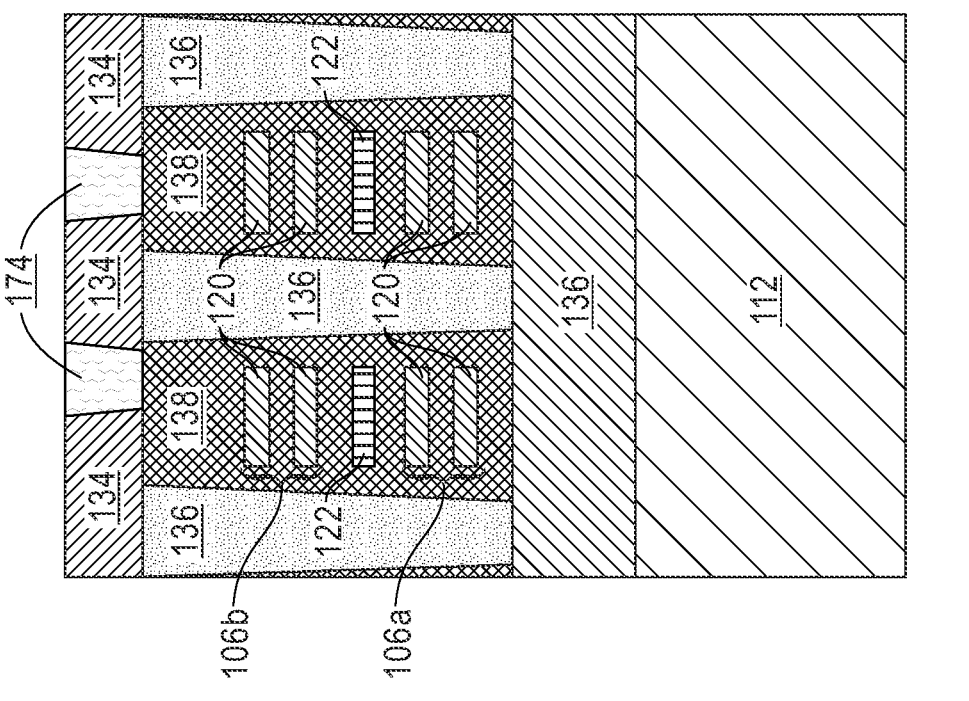
Figure 7C:
Figure 7B:
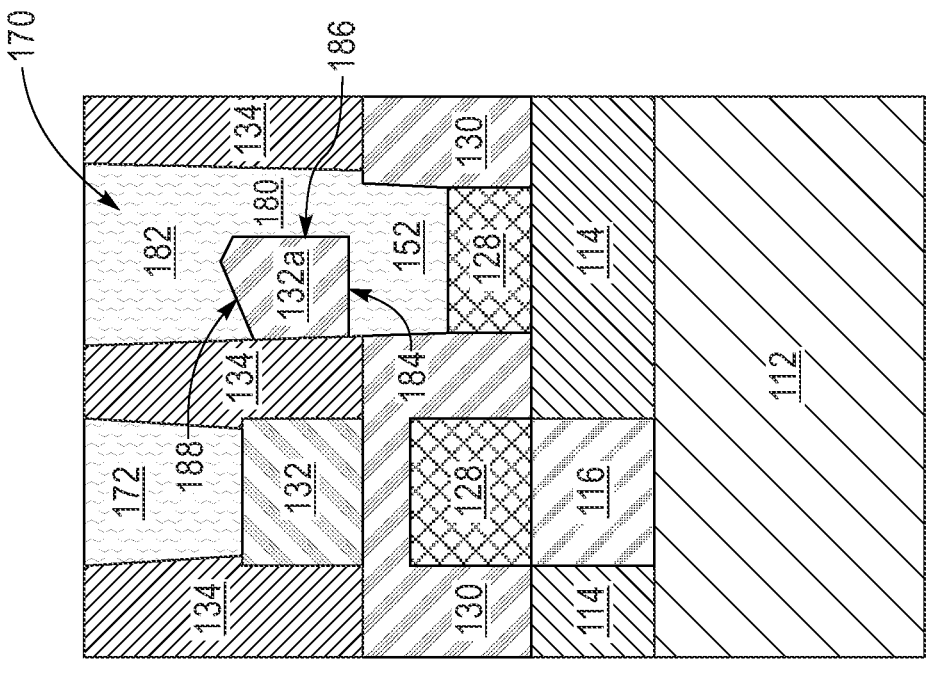

FIGS. 7A-7C depict cross-sectional side views of the semiconductor structure 100 at a stage of fabrication. As mentioned above, the cross-sectional views are along the view lines indicated in FIG. 1. The semiconductor structure 100 includes metalized contacts in place of the openings masked and etched using the OPL 158. Specifically, the semiconductor structure 100 includes a shared S/D contact 170, a first top S/D contact 172, and gate contacts 174. The shared S/D contact 170, first top S/D contact 172, and gate contacts 174 may include silicide and adhesion liners as described above. No high thermal budget process will be performed after this stage, so there's no risk of degradation of silicides causing high resistance between the shared S/D contact 170 and the first S/D 128 and the shared S/D contact 170 and the regrown second S/D 132a is low.

The first top S/D contact 172 and the gate contacts 174 are thus formed as one portion with a (typically rounded) hole extending uniformly from the top of the semiconductor structure 100. The first top S/D contact 172 is connected to a top S/D (e.g., one of the second S/Ds 132) only on a top side, and the gate contact 174 are connected to the HKMG 138. The shared S/D contact 170, on the other hand, has multiple portions including the recessed portion 152, a side portion 180 above the recessed portion 152, and a top portion 182 above the regrown second S/Ds 132a. The shared S/D contacts 170, therefore, contact a top side of the first S/Ds 128 and contact a bottom side, a first lateral side, and a top side of the regrown second S/Ds 132a.

Additionally, the full width or height of the S/Ds may be covered by the shared S/D contact 170. For example, the shared S/D contact 170 may cover a full width of the bottom side 184 of the regrown second S/D 132a, a full height of a first lateral side 186 of the regrown second S/D 132a, and a full width of the top side 188 of the regrown second S/D 132a. This full coverage for both the first S/D 128 and the regrown second S/D 132a provides many benefits. One benefit may be that the contact areas between the shared S/D contact 170 and the S/Ds 128, 132a are large and thus at small/minimal risk for having high resistance. Additionally, the volume of the S/Ds 128, 132a are large enough that to form a sufficient amount of silicide, and therefore epi resistance is also low. Another benefit is that the silicide liners are formed directly before metallization of the shared contact 170, which increases the likelihood that the silicide will operate at expected performance metrics. The silicide on the lateral side 186 of the regrown second S/D 132a is also not a critical failure point, which can be important as vertical silicide can sometimes be more difficult to fabricate perfectly.

Figure 8A:
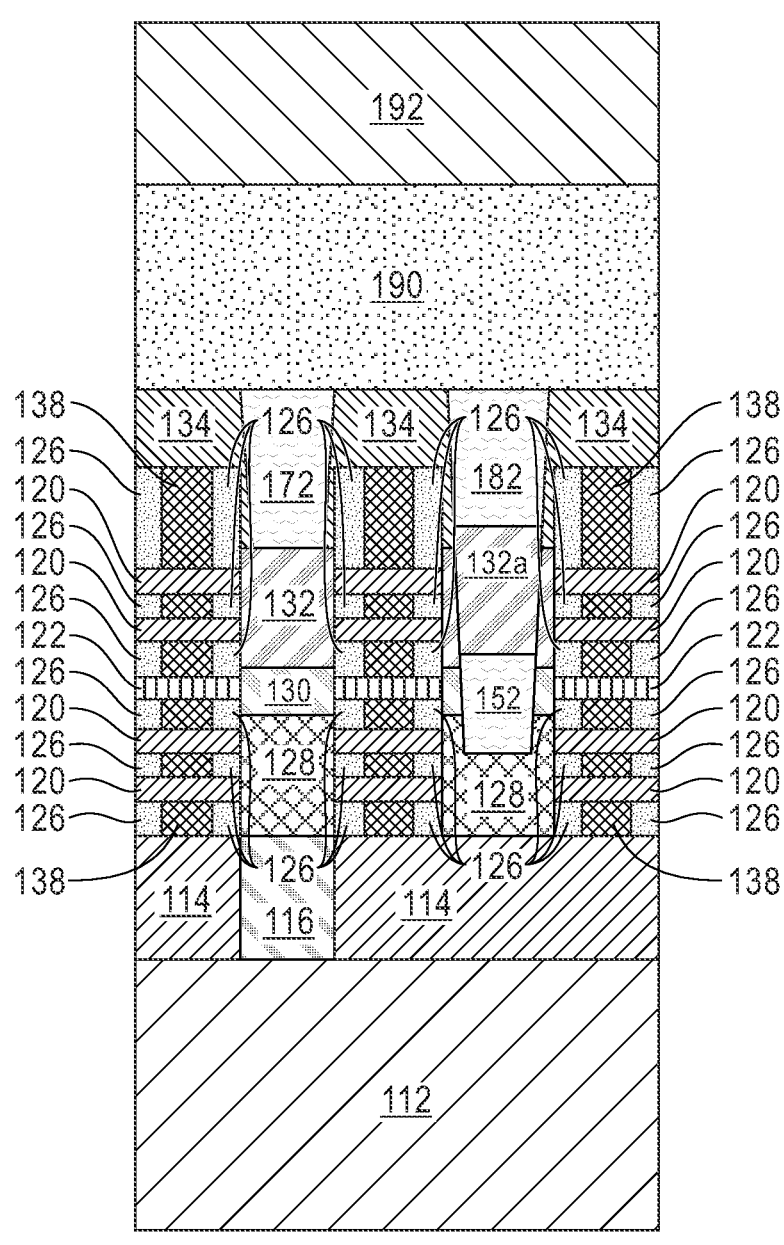
FIGS. 8A-8C depict cross-sectional side views of the semiconductor structure of FIG. 1 at a stage of fabrication, in accordance with one embodiment of the present invention.
Figure 8C:
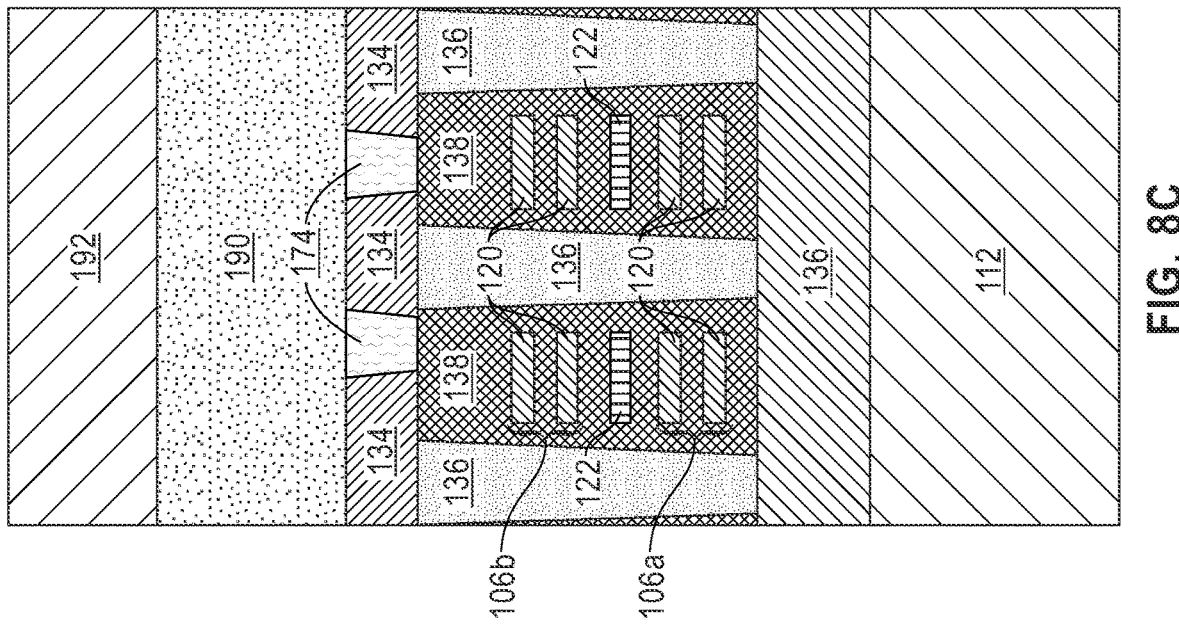
Figure 8B:
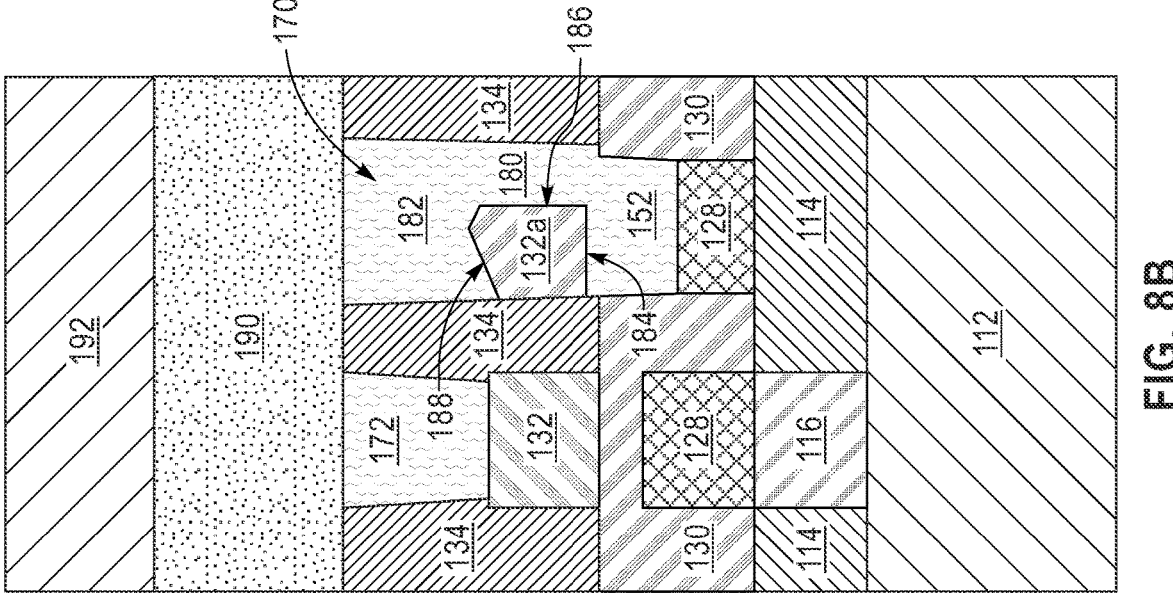

FIGS. 8A-8C depict cross-sectional side views of the semiconductor structure 100 at a stage of fabrication. The semiconductor structure 100 includes back end of line (BEOL) interconnects 190 and a carrier wafer 192. The BEOL interconnects 190 include metal layers that interconnect, power, and deliver signals to the contacts 170, 172, 174 and thereby to the S/Ds 128, 132, 132a, and/or gates 110 of the semiconductor structure 100. The BEOL interconnects 190 are not illustrated to scale, and in certain embodiments the BEOL interconnects 190 may include greater than 10 metal levels to interconnect all the front end of line devices in the semiconductor structure 100.

Figure 9A:
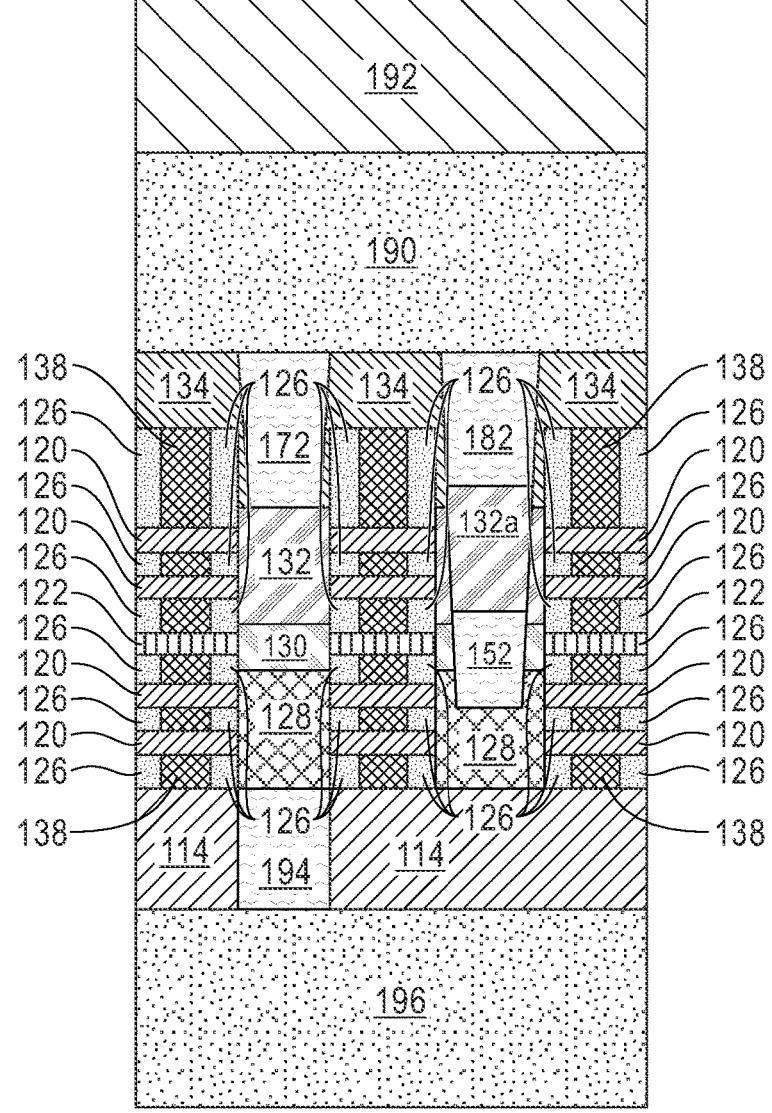
FIGS. 9A-9C depict cross-sectional side views of the semiconductor structure of FIG. 1 at a stage of fabrication, in accordance with one embodiment of the present invention.
Figure 9C:
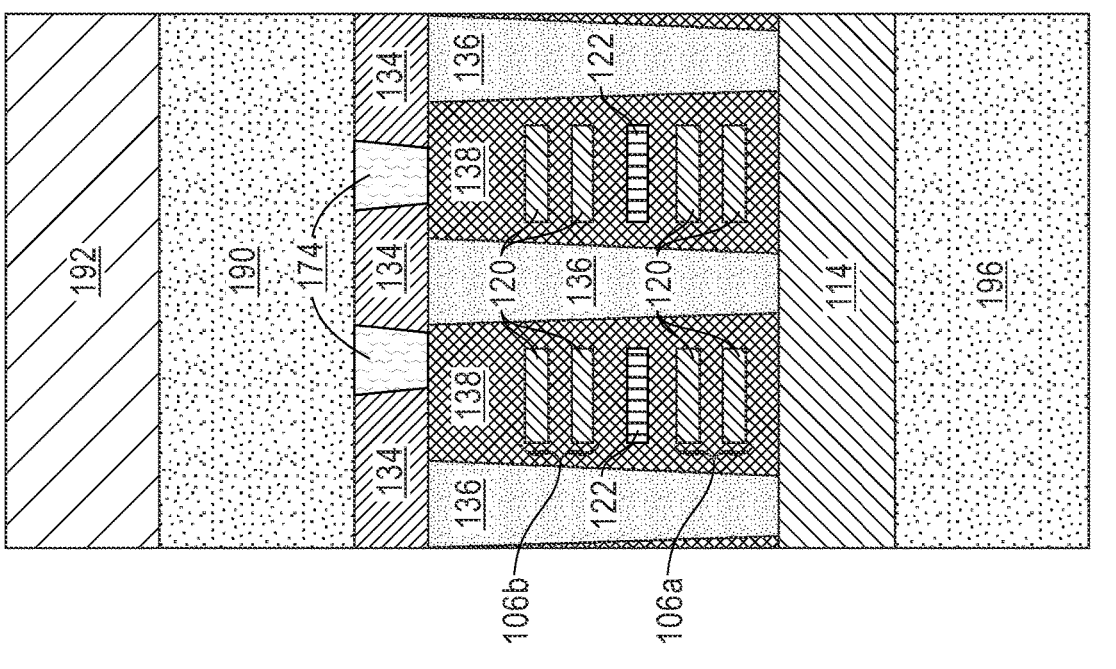
Figure 9B:
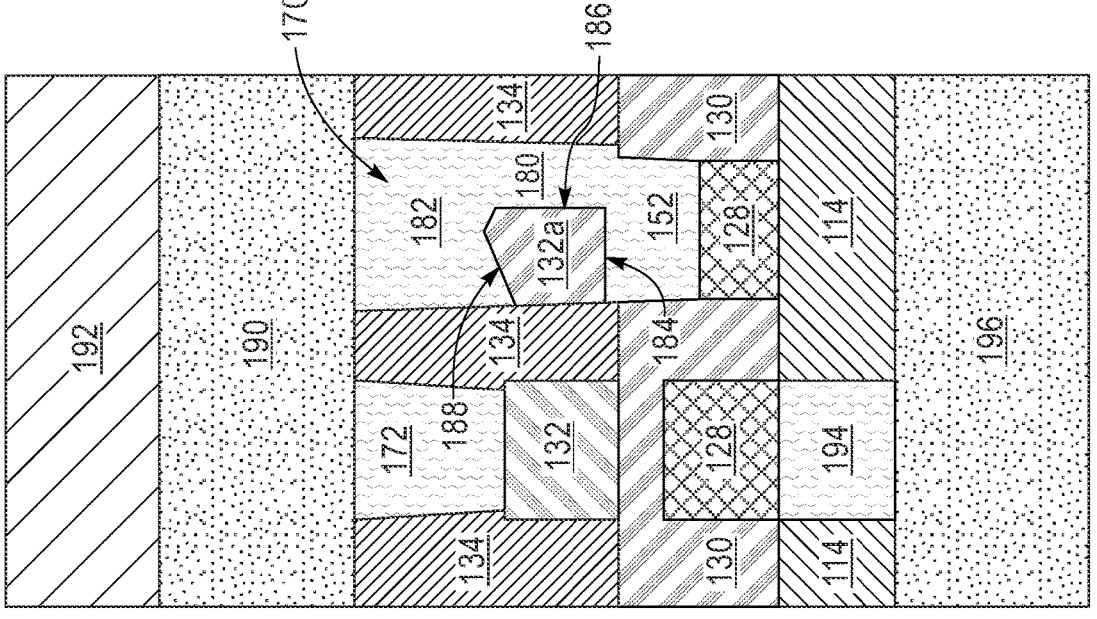

FIGS. 9A-9C depict cross-sectional side views of the semiconductor structure 200 at a stage of fabrication. The semiconductor structure 100 includes backside contacts 194 and backside interconnects (e.g., backside power delivery network BSPDN) 196. The backside contacts 194 a bottom S/D (e.g., one of the first S/Ds 128) connected to a backside contact on a bottom side are formed by replacing the sacrificial contacts 116. In certain embodiments, the semiconductor structure 100 may be flipped, and supported by the carrier wafer 192 so that the substrate 112 may be removed, and the sacrificial contact 116 may be etched in familiar manner from above the semiconductor structure 100. The backside contact 194 may include silicide and adhesion liners similar to the contacts 170, 172, 174 described above. After the backside contact 194 is formed, the backside interconnects 196 may be added with metal layers applied one after the next in a manner similar to the BEOL interconnects 190. The semiconductor structure 100 may then be submitted for advanced packaging.

The integrated circuit chips resulting from the processes described herein can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application is not limited to the exact forms and details described and illustrated, but fall within the scope of the appended claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a first field-effect transistor (FET) comprising a first source/drain (S/D);
a second FET comprising a second S/D squarely above the first S/D; and
a shared S/D contact, comprising:
a recessed portion between the first S/D and the second S/D;
a side portion above the recessed portion, wherein the side portion contacts a lateral side of the second S/D; and
a top portion above the second S/D.

2. The semiconductor structure of claim 1, wherein the recessed portion covers a full width of a top side of the first S/D.

3. The semiconductor structure of claim 1, wherein the recessed portion contacts the first S/D and the second S/D.

4. The semiconductor structure of claim 1, wherein the recessed portion is isolated from a first gate region by an interlayer dielectric.

5. The semiconductor structure of claim 1, wherein the top portion covers a full width of a top side of the second S/D.

6. The semiconductor structure of claim 1, wherein the first FET comprises a bottom S/D connected to a backside contact on a bottom side.

7. The semiconductor structure of claim 1, wherein the second S/D comprises remnants of a preliminary S/D and a regrown portion.

8. A semiconductor structure, comprising:
a first field-effect transistor (FET) comprising a first source/drain (S/D);
a second FET comprising a second S/D squarely above the first S/D; and
a shared S/D contact contacting a top side of the first S/D, and contacting a bottom side, a first lateral side, and a top side of the second S/D.

9. The semiconductor structure of claim 8, wherein the S/D contact covers a full width of the top side of the second S/D.

10. The semiconductor structure of claim 8, wherein the shared S/D contact covers a full width of the bottom side of the second S/D, a full height of the first lateral side of the second S/D, and a full width of the top side of the second S/D.

11. The semiconductor structure of claim 10, wherein a full height of a second lateral side of the second S/D is covered by an interlayer dielectric.

12. The semiconductor structure of claim 8, wherein the first FET comprises a bottom S/D connected to a backside contact on a bottom side.

13. The semiconductor structure of claim 8, wherein the second FET comprises a top S/D connected to a first top S/D contact only on a top side.

* * * * *